(12) United States Patent
Haller et al.

(10) Patent No.: US 6,668,450 B1
(45) Date of Patent: Dec. 30, 2003

(54) METHOD FOR THE PRODUCTION OF AN ELECTROTECHNICAL DEVICE

(75) Inventors: Hans-Otto Haller, Niedereschach (DE); Volker Strubel, Freiburg (DE); Gunter Beitinger, Neumarkt (DE)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/340,567

(22) Filed: Jun. 28, 1999

(30) Foreign Application Priority Data

Jun. 30, 1998 (DE) ............................. 198 29 248

(51) Int. Cl.⁷ ................................. H05K 3/10
(52) U.S. Cl. ..................... 29/846; 29/847; 29/848; 29/855; 29/856; 174/250; 174/255
(58) Field of Search ............... 29/846, 847, 852, 29/855, 856; 174/250, 255, 260, 257, 258, 261

(56) References Cited

U.S. PATENT DOCUMENTS

| | | | |
|---|---|---|---|
| 4,354,895 A | * 10/1982 | Ellis | 156/631 |
| 5,046,238 A | * 9/1991 | Daigle et al. | 29/830 |
| 5,058,250 A | * 10/1991 | Turnbull | 29/25.35 |
| 5,090,122 A | 2/1992 | Kitagawa | |
| 5,233,753 A | 8/1993 | Wolf et al. | |
| 5,480,503 A | * 1/1996 | Casey et al. | 156/89 |

FOREIGN PATENT DOCUMENTS

| | | | |
|---|---|---|---|
| DE | 4120670 | 1/1992 | ............ H05K/3/20 |
| DE | 4036592 | 5/1992 | ............ H05K/3/22 |
| EP | 0624054 | 11/1994 | |
| EP | 0969703 | * 5/2000 | |
| WO | 8904880 | 6/1989 | |

OTHER PUBLICATIONS

Patent Abstracts of Japan, 63–288093, Mar. 22, 1989, vol. 13/No. 117.
Patent Abstracts of Japan, 01–145114, Jun. 7, 1989.
Eisler, Paul: "Printed Circuits Technology of Foil Etching," 1961.
German Search Report dated Dec. 17, 1998.
Patent Abstracts of Japan, vol. 014, No. 247 (M–0978), May 25, 1990, & JP 02067114.
Search Report for EPO Application No. 99111866.2 dated Jan. 21, 2000.

* cited by examiner

*Primary Examiner*—Carl J. Arbes
*Assistant Examiner*—Minh Trinh
(74) *Attorney, Agent, or Firm*—Joseph S. Tripoli; Joseph J. Laks; Patricia A. Verlangieri

(57) ABSTRACT

The invention relates to a method for the production of an MID device. Proceeding from a conductor track sheet, which comprises a support sheet as well as conductor tracks arranged thereon, a plastic body is injection-molded onto this conductor track sheet. The conductor tracks have a surface having numerous microscopically small projections and depressions and are designed so as to thereby produce a positively locking connection between the conductor tracks and the plastic body.

10 Claims, 4 Drawing Sheets

METHOD FOR THE PRODUCTION OF AN ELECTROTECHNICAL DEVICE

FIELD OF THE INVENTION

The invention relates to a method for the production of an electrotechnical device. In particular, the invention relates to the production of so-called MID devices ("Moulded Interconnect Devices") which are formed from a plastic moulding which intrinsically combines the functions of a conventional printed circuit board and mechanical fixing elements used to retain electronic components.

BACKGROUND OF THE INVENTION

It is known in the prior art to produce such MID devices proceeding from plastic mouldings to which whole-area copper foil is applied by means of a hot stamping method. In this method, on the one hand the copper foil is structured so as to produce conductor tracks and on the other hand these conductor tracks are connected to the plastic moulding by the underlying plastic being melted on. This method makes it possible to produce only relatively coarse conductor structures which only have conductor tracks with similar widths.

It is also known to connect a structured copper foil to a plastic moulding e.g. by hot rolling. This method necessitates the difficult handling of copper foils which, mechanically, are extremely sensitive.

Furthermore, it is known for plastic films which are provided with electrical conductor tracks on one side or on both sides to be backed by injection-moulding with the same or a different plastic, as a result of which a 3-dimensional circuit support is produced. However, this method is suitable only for plastics which combine by melting in the course of the backing by injection-moulding, and cannot be used e.g. for liquid crystal polymers (LCPs).

Finally, it is known for conductor structures made of electrically conductive material such as conductive adhesive, for example, to be applied to a support sheet and for this to be transferred to a circuit support by means of an adhesive system, it being necessary to apply a separating means between the support sheet and the conductor tracks. Both the adhesive system and the separating means can adversely affect the properties of the arrangement in respect of their flammability.

SUMMARY OF THE INVENTION

Taking this as a departure point, the object of the invention is to specify a method according to which MID devices can be produced reliably, even with fine conductor track structures, and cost-effectively by virtue of the capability of industrial-scale manufacture.

This object is achieved by means of a method according to claim 1.

The method according to the invention has the advantage that the sensitive conductor track structures are formed on a support sheet which is mechanically and thermally insensitive and is simple to handle. This sheet can be supplied e.g. from a roll during the production of the MID device. The support sheet is peeled away only when the conductor track structure is fixedly connected to the plastic body of the subsequent MID device, with the result that damage to the conductor track during the production of the device is Practically precluded.

The conductor track structures can be produced by the electrodeposition of copper. For this purpose, firstly a whole-area, thin first copper layer is coated onto the support sheet. In order to obtain adhesion with a defined peel-off force between the support sheet and the first copper layer, an adhesion promoting layer may be coated onto the support sheet, which adhesion promoting layer may additionally contain palladium nuclei for implementing the metallization. The copper layer is subsequently built up to the desired thickness by electrodeposition in accordance with a mask which leaves the conductor routes free. Depending on the quality of the support sheet, it may also be necessary to clean the support sheet before the adhesion promoting layer is coated on. The economical consumption of copper in this method has an advantageous effect both directly during the production of the device and during the work-up of residues.

It is particularly advantageous if the support sheet chosen is a temperature-resistant, polyimide-based sheet, because this sheet does not adhere to the plastic body forming the circuit support. This makes it possible for the support sheet to be peeled away without additional separating means. Furthermore, the adhesion promoting layer which facilitates the metallization may aid, the reliable peeling-away of the support sheet from the conductor tracks when the latter are connected to the circuit support.

Since the first copper layer short-circuits the conductor track structures together, it may be necessary in many cases for this first copper layer to be removed again during the production process of the MID device. This can be done e.g. after the support sheet has been peeled away or before the plastic body is injection-moulded onto the conductor track sheet.

A soldering resist mask can be coated onto the structured module by means of a screen printing method. Furthermore, it is advantageous if the bare conductor tracks are passivated e.g. with rosin, in order to preserve the solderability of the conductor tracks.

In a particularly advantageous embodiment of the invention, the second electrically conductive layer, which forms the conductor tracks, is applied in such a way that the surface of the conductor tracks has numerous projections and depressions. When the plastic body is injection-moulded onto these conductor tracks, the projections act like anchors in the plastic, resulting in a very firm positively locking connection between the copper conductor tracks and the plastic body. This property is particularly advantageous if the plastic used is LCP plastic material ("Liquid Crystal Polymer"), which adheres poorly to smooth copper surfaces.

Furthermore, the invention relates to an electrotechnical device, in particular an MID device, having a base body made of plastic and also having electrical conductor tracks fixedly connected to the base body. Such devices intrinsically combine both electrical and mechanical functions and, in this way, enable e.g. a more space-saving design of electrical apparatuses. MID devices are composed to a considerable extent of plastic which, for safety reasons, is provided with a flameproofing agent. Furthermore, such devices contain metals. The mixture of different materials makes it more difficult to recycle such devices at the end of their service life.

Taking this as a departure point, a second object of the invention is to provide an electrotechnical device, in particular an MID device, which can be produced cost-effectively and has improved properties compared with conventional devices of this type.

This object is achieved by means of a device according to claim 18, which is characterized in that the conductor tracks have a multiplicity of depressions and projections which are suitable for imparting a positively locking connection to the base body made of plastic.

One advantage of this device is that the particular structuring of the conductor tracks means that it is now possible also to use plastics which adhere poorly to materials from which conductor tracks are usually produced. This applies e.g. to LCP plastic material, which is distinguished by its intrinsically flame-retarding properties. The use of this material has the advantage that it is possible to dispense with the additional use of flame-retarding substances, which frequently make it difficult to recycle used apparatuses.

BRIEF DESCRIPTION OF THE DRAWINGS

An exemplary embodiment of the invention is illustrated in the drawing, in which.

DETAILED DESCRIPTION OF THE PREFERED EMBODIMENT

FIG. 1 shows successive manufacturing stages which are run through during the inventive production of an MID device. The individual work steps of the production method are also illustrated in the flow diagram shown in FIG. 2.

Figure 1A:
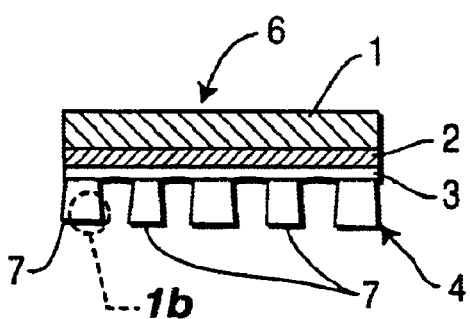
FIG. 1 shows various manufacturing stages of an MID device according to the invention.
Figure 2:
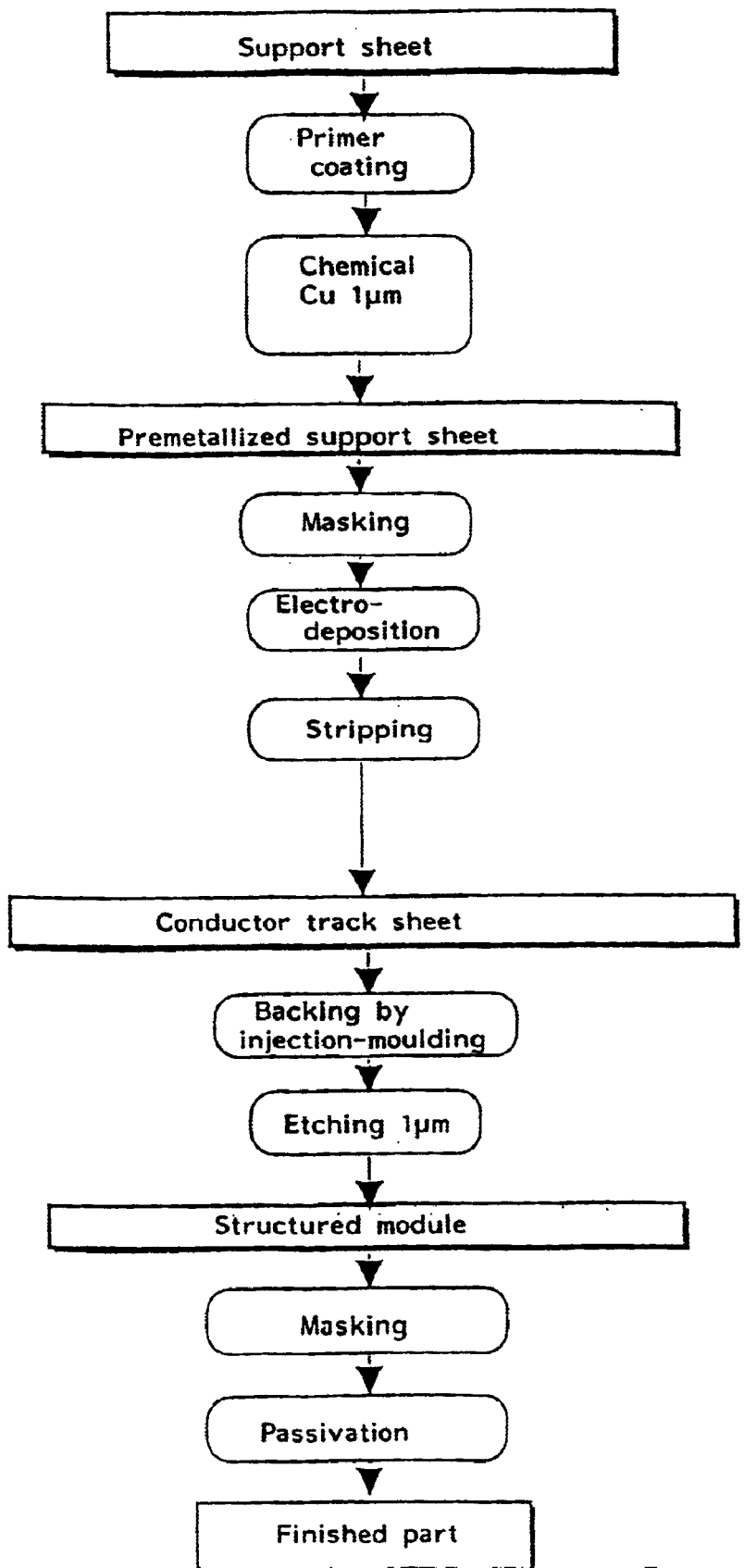
FIG. 2 shows a flow diagram of the inventive method for the production of the MID device illustrated in FIG. 1.

The method proceeds from a temperature-resistant support sheet 1, which may be woven e.g. from aramid or Kevlar fibres. Firstly an adhesion promoting layer 2 is coated onto the support sheet 1, which has high flexibility and high strength, the said adhesion promoting layer containing nuclei of palladium metal which serve as a catalyst for the chemical coating of a whole-area, first copper layer 3, a premetallized support sheet thereby being produced. The adhesion. promoting layer 2 is also referred to as "primer". If necessary, it may be possible to provide for cleaning of the support sheet 1 before the adhesion promoting layer 2 is coated on. The thickness of this first copper layer 3 is approximately 1 $\mu$m (FIG. 1a). Of course, it is also possible to choose layer thicknesses which differ from this.

In a next step, the premetallized support sheet is coated with a photoresist and a mask (not illustrated in FIG. 1a) is produced according to a method known per se. A second copper layer 4 having a thickness of approximately 36 $\mu$m is deposited in the windows of the mask by means of an electrodeposition process. Afterwards, the photoresist mask is lifted off using a solvent ("stripping"), resulting in the production of a conductor track sheet 6 (illustrated in FIG. 1a) which is formed from the premetallized support sheet with conductor tracks 7 arranged thereon.

Figure 1B:
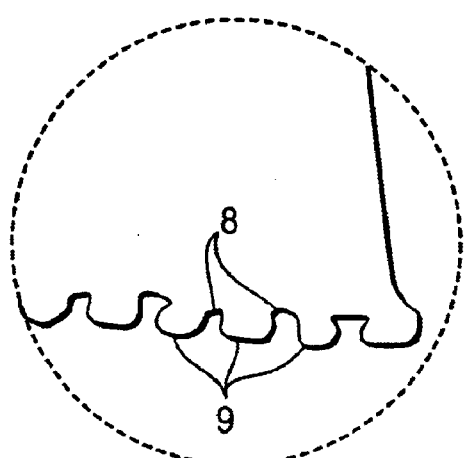

The second copper layer 4 is coated on by a method in which the deposited copper layer is produced with a microscopically rough surface. FIG. 1b illustrates a detail from FIG. 1a and clearly shows a so-called "cauliflower structure" of the copper layer with numerous depressions 8 and projections 9. The particular surface structure is also frequently referred to as a so-called "BOLTA structure". In addition, the cross section of the conductor tracks 7 increases as the layer thickness of the deposited layer increases, as is illustrated in FIG. 1a. This type of undercut conductor tracks is not absolutely necessary for implementing the invention, however, which is why the conductor tracks in FIGS. 1c–1e are shown with side walls running perpendicularly to the surface of the support sheet 1.

Figure 1C:
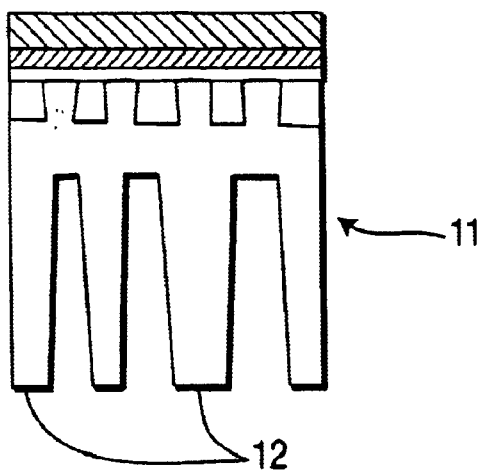
Figure 1D:
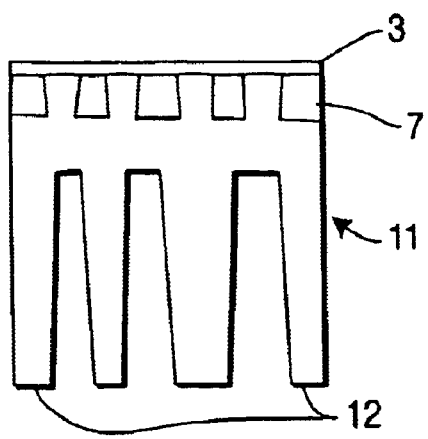
Figure 1E:
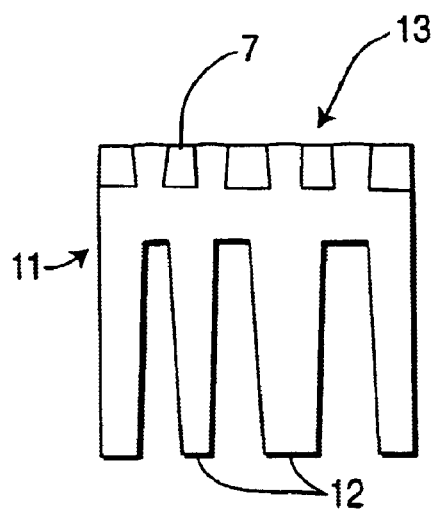

The conductor track sheet is then inserted into an injection mould, for the purpose of injection-moulding a plastic body 11 thereon (FIG. 1c). The plastic body 11 may be composed e.g. of LCP material, which is distinguished by intrinsically flame-retarding properties. Of course, it is also possible to use other kinds of plastic.

When the liquid plastic material is injection-moulded onto the conductor track sheet 6, a positively locking connection of high mechanical stability is produced between the conductor tracks 7 and the plastic body 11 on account of the abovementioned "cauliflower structure" of the surface of the said conductor tracks. If the conductor tracks 7 are additionally undercut, as is shown in FIG. 1a, an additional positively locking joint is produced, which further increases the stability of the connection between the conductor tracks 7 and the plastic body.

On the side remote from the support sheet, the plastic body 11 is designed in such a way that mechanical elements such as supports, struts or other fixing elements 12 are already provided, as is illustrated in FIG. 1c. These mechanical elements 12 serve for fixing electrical components or else for mounting the completed MID device e.g. in a housing.

In a next work step, the support sheet 1 is peeled away, the adhesion promoting layer 2 remaining entirely or at least predominantly connected to the support sheet 1. An essential prerequisite for peeling away the support sheet without any problems is the abovementioned robust connection between the conductor tracks 7 and the plastic body 11. As a result, the whole-area, first copper layer 3 is uncovered (FIG 1d). In order to establish the functionality of the MID device, it may be necessary to completely remove the first copper layer 3, because the latter short-circuits the conductor tracks 7 together. The removal is effected by an etching step e.g. using sulphuric acid ($H_2SO_4$) and hydrogen peroxide ($H_2O_2$), in order to obtain a structured module (FIG. 1e) which is designated as a whole by the reference symbol 13.

In the present case, a temperature-resistant, polyimide-based support sheet which does not adhere to the plastic body is chosen. This facilitates the peeling-away of the support sheet without additional separating means. However, it is also possible to use other types of support sheets. Furthermore, the adhesion promoter required for the metallization may, after the transfer process, aid the reliable peeling-away of the support sheet from the conductor tracks.

In a further step, the structured module 13 is masked with soldering resist by a screen printing method. After the non-covered regions of the conductor tracks 7 have been passivated as a result of the coating by rosin, in order to preserve the solderability of the said conductor tracks, the MID device is completed.

In principle, other layer thicknesses and deposition methods are conceivable for the second copper layer 4 as well. All that is important is that the current-carrying capacity of the conductor tracks is sufficient for the respective application and that the surface of the conductor tracks is designed in such a way as to enable a positively locking connection to the plastic body 11 injection-moulded thereon.

Figure 3:
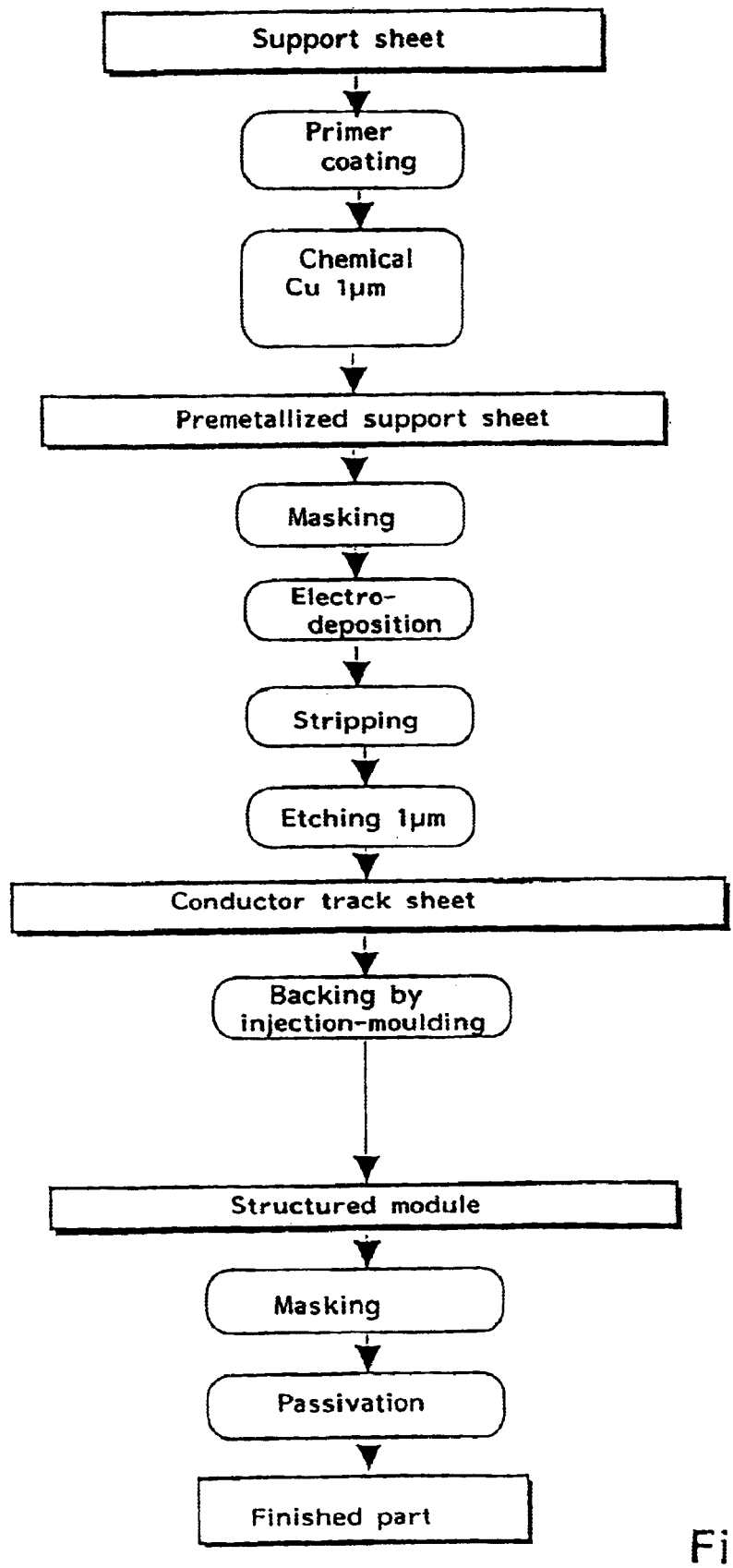
FIG. 3 shows an alternative flow diagram to that in FIG. 2.

FIG. 3 illustrates a flow diagram for a production method which can be used as an alternative to the production method described at the beginning. The two methods are identical as far as the completion of the premetallized support sheet and differ essentially by the fact that the order in which the first copper layer 3 is etched away and the plastic body 11 is injection-moulded on is interchanged.

Proceeding from the premetallized support sheet (FIG. 1a) the first and second copper layers 3, 4 are etched back by 1 to 2μm in accordance with the alternative production method that will now be described. The consequence of this is that the first copper layer 3 is completely etched away between the conductor tracks 7 of the second copper layer 4, with the result that the conductor tracks 7 are electrically isolated from one another. In contrast to the first copper layer 3, the layer thickness of the conductor tracks 7 is reduced only insignificantly owing to the greater material thickness of 36μm. Afterwards, the plastic body 11 is injection-moulded on and the support sheet 1 is peeled away, in order to obtain a structured module 13 (FIG. 1e). Just as in the method described at the beginning, a finished part is produced from the module 13 by the application of a soldering resist mask and the passivation of the bare regions of the conductor tracks 7.

Figure 4:
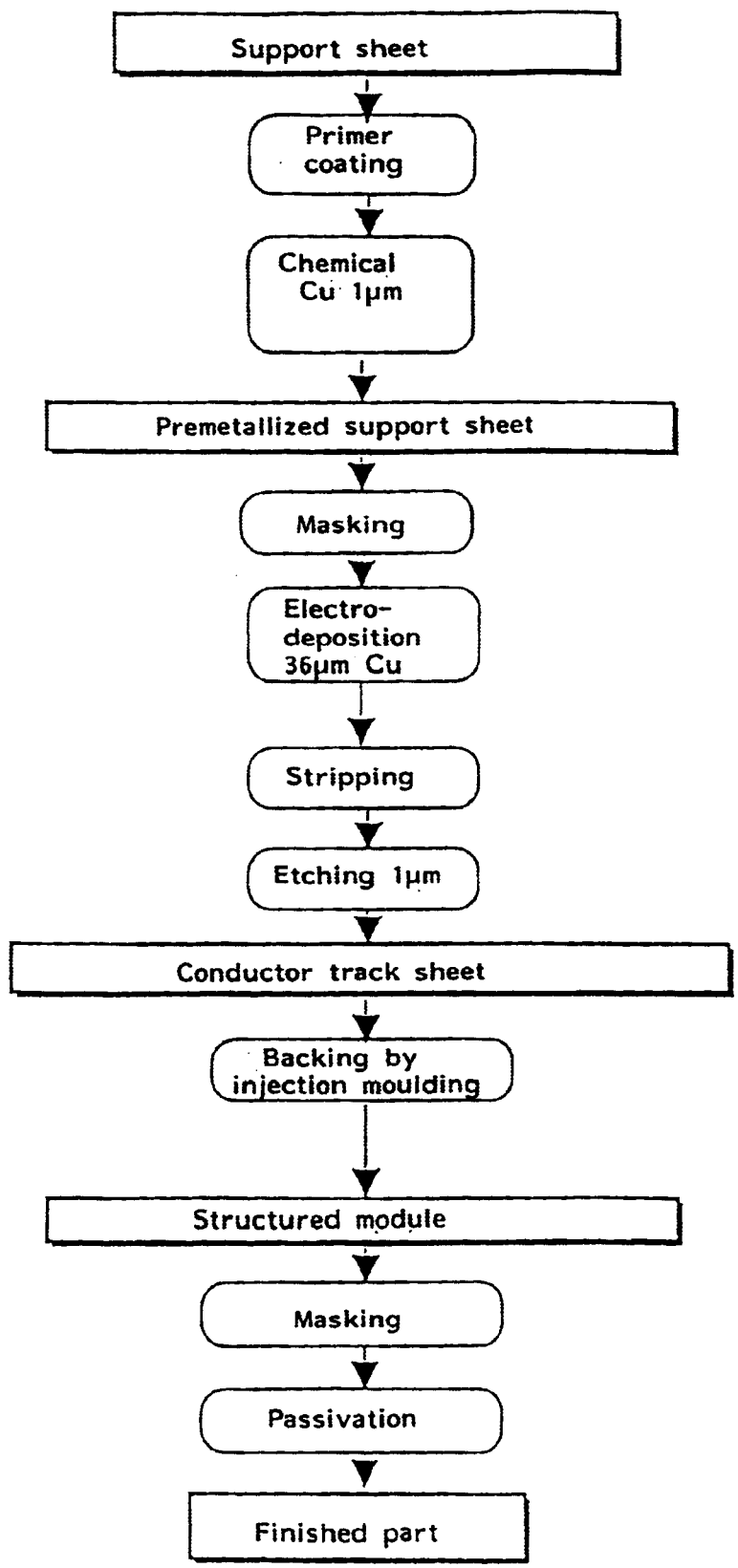
FIG. 4 shows a flow diagram for elucidating a further production method according to the invention.

FIG. 4 illustrates a further inventive method for the production of an MID device using a flow diagram. This method differs from the two methods described above by virtue of the fact that the plastic body 11 is not injection-moulded onto the conductor track sheet, but rather the conductor track sheet 6 is fixedly connected to a prefabricated plastic body 11 by means of hot rolling.

The conductor track sheet 6 is produced in exactly the same way as was described in connection with the method illustrated in FIG. 3. The conductor track sheet 6 is then fixedly connected to the plastic body 11, which is produced from thermoplastic material, by means of hot rolling. Since, in the course of hot rolling, the surface of the thermoplastic plastic body 11 liquefies at least momentarily and penetrates into the depressions 8 in the surfaces of the conductor tracks, a robust, positively locking connection between the conductor tracks 7 and plastic body 11 is produced in the case of this method as well. The support sheet is peeled away to leave once again a structured module 13, which is processed further to form a finished part in the manner already described. Since the finely structured conductor tracks 7 are connected to the support sheet to form a conductor track sheet 6 during the production of the MID device, the handling problems with sensitive copper foils as described in the introduction do not occur.

What is claimed is:

1. A method for producing a moulded interconnect device (MID) for connecting electronic components, comprising the following steps:
    a) applying a first electrically conductive layer to a support sheet;
    b) covering the first conductive layer with a structured mask;
    c) producing conductor tracks by selectively depositing a second electrically conductive layer by means of an electrodeposition process on the first conductive layer into a number of openings or windows of the mask;
    d) removing the mask, resulting in the production of a conductor track sheet, said conductor track sheet including the support sheet, the first electrically conducting layer, and a three-dimensional conductor track structure adhering thereto;
    e) combining the conductor track sheet produced in step d) and a plastic body in order to complete the moulded interconnect device (MID);
    f) peeling away the support sheet;
    g) removing the first conductive layer;
    wherein the mask and/or the process from step c) is adapted so as to form a microscopically rough surface and/or an increasing cross-sectional width of the conductor tracks with increasing distance from the first electrically conducting layer, thereby producing an interlocking structure for mechanically locking with the plastic body joined to the conductor track sheet in step e).

2. The method according to claim 1, further comprising the step of coating an adhesion promotion layer onto the support sheet prior to the applying step.

3. The method according to claim 2, further comprising the step of cleaning the support sheet prior to the coating step.

4. The method according to claim 1, wherein the support sheet is a polyamide-based support sheet.

5. The method according to claim 1, wherein the combining step comprises the step of injection moulding the plastic body onto the conductor track sheet.

6. The method according to claim 1, wherein the plastic body is a prefabricated plastic body, and the combining step comprises the step of fixedly connecting the conductor track sheet to the prefabricated plastic body.

7. The method according to claim 6, wherein the fixedly connecting step comprises the step of hot-rolling of the conductor track sheet onto the prefabricated plastic body.

8. The method according to claim 6, wherein the fixedly connecting step comprises the step of bonding the conductor track sheet onto the prefabricated plastic body.

9. The method according to claim 1, further comprising the step of at least partly masking the resulting conductor tracks by a soldering resist mask.

10. The method according to claim 9, further comprising the step of passivating the conductor tracks at the locations where the soldering resist mask has openings.

* * * * *